US005457637A

United States Patent [19]
Seitchik et al.

[11] Patent Number: 5,457,637
[45] Date of Patent: Oct. 10, 1995

[54] FLASH WAVEFORM ANALYZER METHOD AND DEVICE

[75] Inventors: Jerold A. Seitchik; Thomas J. Aton, both of Dallas, Tex.; Scott D. Jantz, Jacksonville, Fla.

[73] Assignee: Texas Instruments Inc., Dallas, Tex.

[21] Appl. No.: 110,594

[22] Filed: Aug. 20, 1993

[51] Int. Cl.$^6$ ........................................ G01R 31/08
[52] U.S. Cl. .................. 364/487; 324/76.24; 324/76.35; 324/532; 364/481
[58] Field of Search ........................ 364/487, 481; 324/76.24, 76.26, 76.27, 76.42, 76.58, 76.59, 618, 76.35, 76.36, 76.37, 532, 533, 534, 535; 327/91; 333/156, 161, 164, 165, 166

[56] References Cited

U.S. PATENT DOCUMENTS

| | | | |
|---|---|---|---|
| 3,843,926 | 10/1974 | Espenlaub et al. | 324/76.24 X |
| 3,977,002 | 8/1976 | Barton | 324/76.42 X |
| 4,060,850 | 11/1977 | Speiser | 324/76.35 X |
| 4,075,697 | 2/1978 | Ochiai et al. | 324/76.24 X |
| 4,091,379 | 5/1978 | Wu et al. | 364/487 X |
| 4,446,420 | 1/1984 | Drouet | 324/535 X |
| 4,641,348 | 2/1987 | Neuder et al. | 324/76.24 X |
| 4,667,152 | 5/1987 | Hayes et al. | 324/76.24 |
| 5,017,860 | 5/1991 | Germer et al. | 364/487 X |
| 5,138,265 | 8/1992 | Kawamura et al. | 324/535 |
| 5,146,170 | 9/1992 | Ishikawa et al. | 324/532 X |

Primary Examiner—Emanuel T. Voeltz
Assistant Examiner—Eric W. Stamber
Attorney, Agent, or Firm—William B. Kempler; Douglas A. Sorensen; Richard L. Donaldson

[57] ABSTRACT

A flash waveform analyzer (10) includes a transmission line (12) for propagating a signal from an input (14). The transmission line (12) contains a plurality of samplers (16) located at different points along the transmission line (12). Each sampler (16) is activated by a strobe pulse from a strobe source (18) in order to measure a characteristic of the signal at the different points along the transmission line (12). The propagation velocity of the signal is made slower than the propagation velocity of the strobe pulse by using a different dielectric constant in the transmission line (12) than that of the strobe delay line (17). The characteristic measured by each sampler (16) is sent to a multiplexer (20) that selectively outputs the measured characteristic from each sampler (16) to an analog-to-digital converter (22) for processing and subsequent analysis.

17 Claims, 2 Drawing Sheets

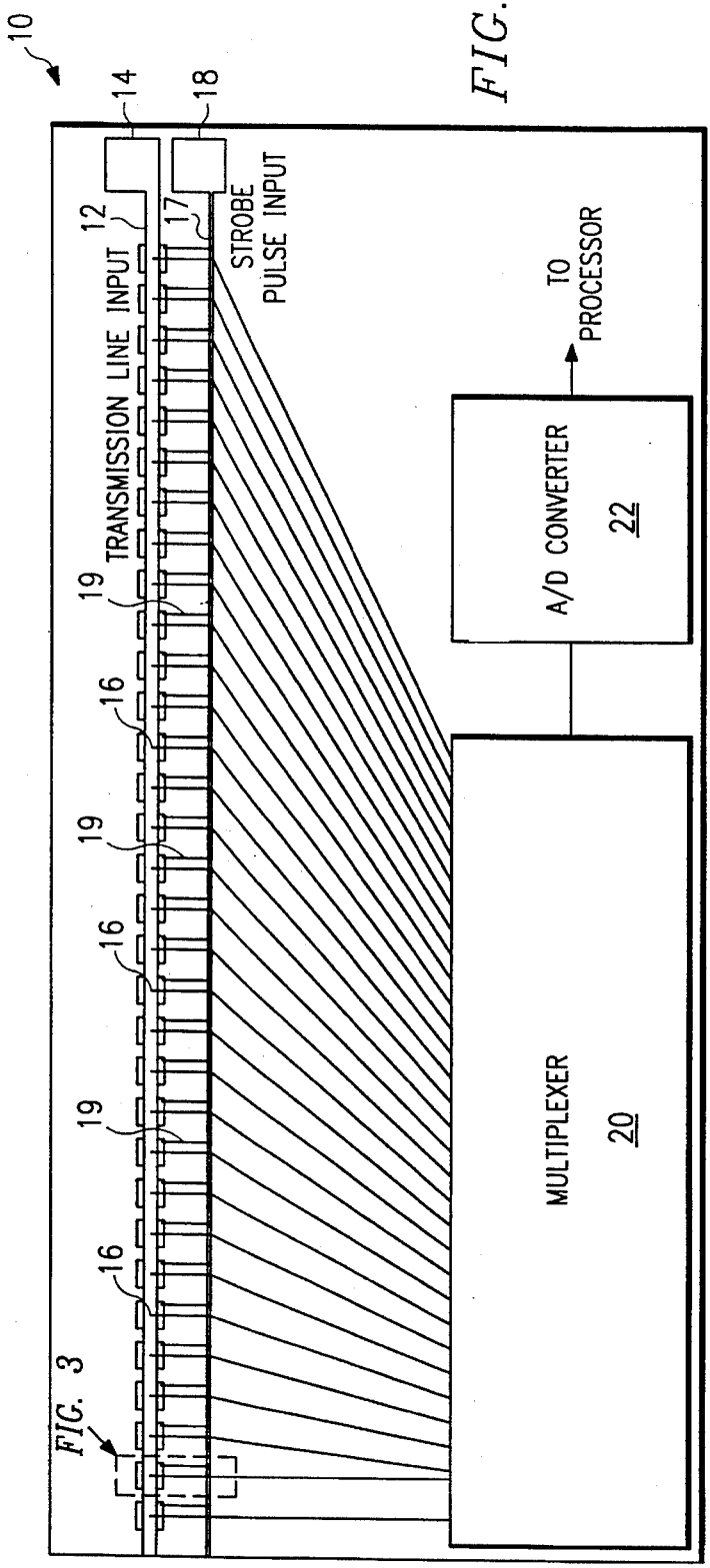
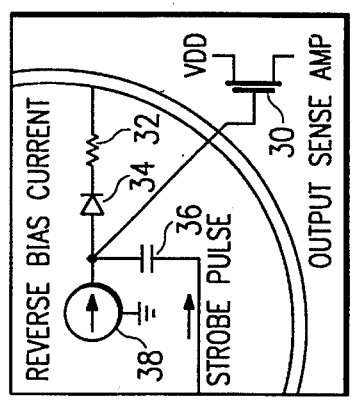

FLASH WAVEFORM ANALYZER METHOD AND DEVICE

TECHNICAL FIELD OF THE INVENTION

The present invention relates in general to signal analysis techniques and more particularly to a flash waveform analyzer method and device.

BACKGROUND OF THE INVENTION

Traditional approaches to voltage waveform analysis involve repeated sampling of a signal at a particular point along the transmission line. This traditional approach is limited by the minimum time that can be achieved between successive samples. Previous efforts to decrease the effective time between samples have used multiple samplers at a single point on the transmission line to sample at slightly displaced instants of time. The multiple samples are taken at staggered times and thus the sampling rate is an important limiting characteristic in traditional non-repetitive waveform analysis techniques.

Some repetitive sampling techniques also provide time domain signals that are converted to spacial domain signals in order to accurately read and analyze a signal. Some analyzers convert the signal into an acoustic signal and use spaced detectors to measure the signal amplitude at different times. These analyzers perform continuous signal detection by use of piezoelectric transducers. Other types of analyzers use the signal to deflect an electron beam which is swept across a matrix to achieve the desired sampling. In electron beam analyzers, the signal must be converted into an intensity modulated electron beam, resulting in sequential data acquisition. These types of analyzers are complex, difficult to use, not readily integrated on a single semiconductor device, or are efficient for only repetitive electrical transients in the signal. Therefore, it is desirable to have an analyzer that is not limited by sampling rate, does not rely on time domain signal sampling, and can handle non-repetitive electrical transients in the signal.

SUMMARY OF THE INVENTION

From the foregoing, it may be appreciated that a need has arisen for a device and method that efficiently captures high frequency non-repetitive signals for analysis. A need has also arisen for a solid state approach to waveform analysis. Further, a need has arisen for a waveform analyzer that is not limited by the sampling rate in order to perform signal analysis.

In accordance with the present invention, a flash waveform analyzer method and device are provided which substantially eliminate or reduce disadvantages and problems associated with traditional waveform analysis approaches.

According to an embodiment of the present invention, there is provided a flash waveform analyzer that includes a transmission line for carrying a signal to be analyzed. A plurality of samplers are spaced at different points along the transmission line. The samplers measure a characteristic of the signal at the different points at a specific instant in time in order to capture the entire signal length.

The device and method of the present invention provide various technical advantages over traditional waveform analysis approaches. For example, one technical advantage is in placing samplers at different points along the transmission line to obtain a spatial sampling of the signal. Another technical advantage is a solid state method for obtaining time domain signals from spatial sampling without transferring the signals to another form such as an electron beam or an acoustic wave. Yet another technical advantage is in being able to analyze non-repetitive electrical transients in the signal without high frequency sampling rates. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with accompanying drawings, wherein like reference numerals represent like parts, in which:

FIG. 1 illustrates a block diagram of a flash waveform analyzer;

FIG. 3 illustrates a simplified schematic diagram of a sampler used in the flash waveform analyzer.

DETAILED DESCRIPTION OF THE INVENTION

Figure 2:
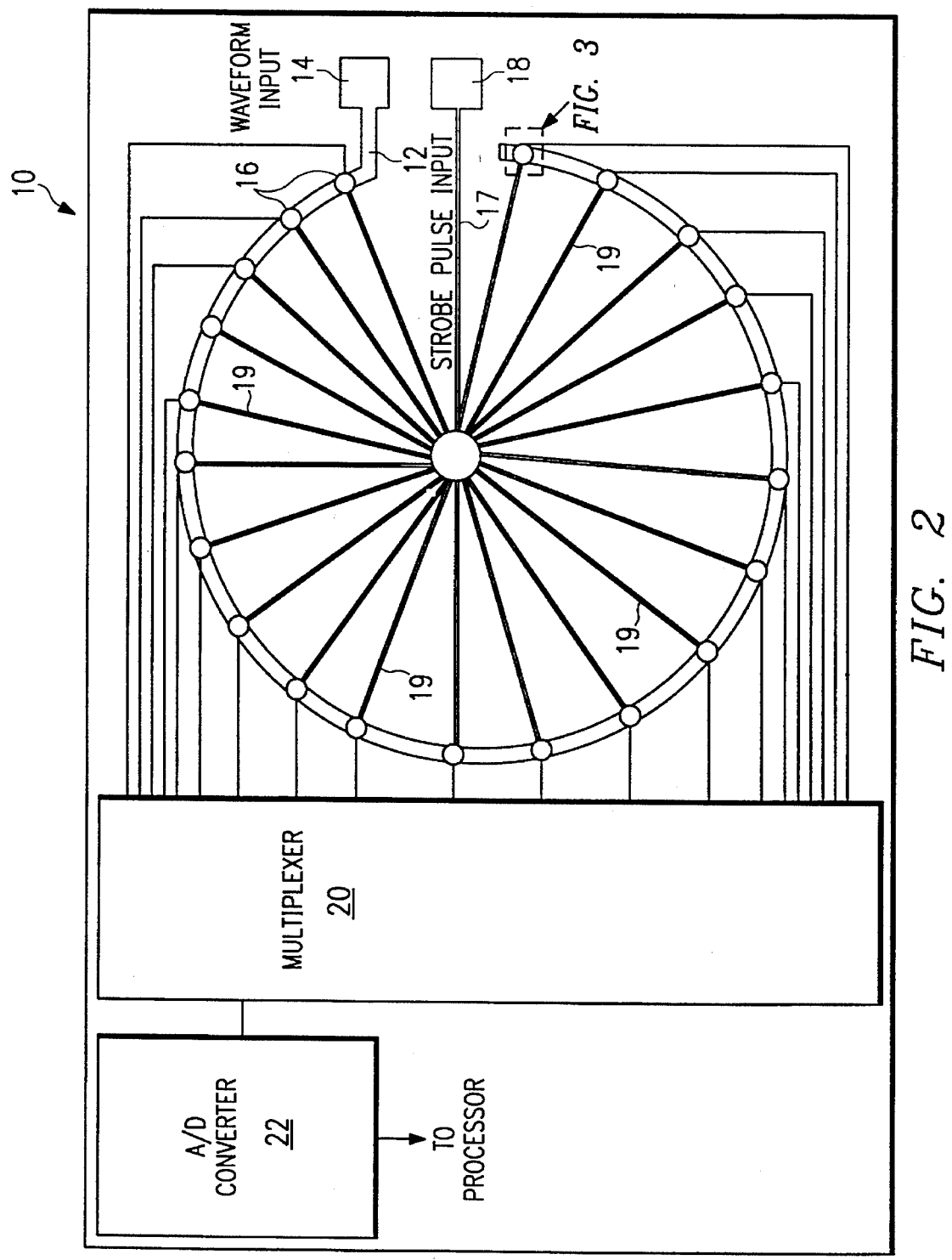
FIG. 2 illustrates a block diagram of another embodiment of the flash waveform analyzer.

FIG. 1 is a block diagram of an embodiment of a flash waveform analyzer 10. Flash waveform analyzer 10 includes a transmission line 12 that receives a signal from an input 14. A plurality of samplers 16 are within transmission line 12, each receiving a strobe pulse propagated down a strobe delay line 17 from a strobe source 18. A multiplexer 20 receives an output generated by each sampler 16 representing a characteristic of the signal. The signal characteristic measured by each sampler 16 may include a representation of the voltage, current, or power of the signal. Multiplexer 20 sequentially selects one of the sampler outputs as an input to an analog-to-digital converter 22.

In operation, a signal enters input 14 and propagates along transmission line 12. Strobe source 18 generates a strobe pulse that propagates to each sampler 16 along strobe delay line 17 and initiates activation of each sampler 16. Samplers 16 are located at different points along transmission line 12 and a characteristic of the signal is measured by each sampler at each sampler point along transmission line 12. Signals measured by sampler 16 are received at multiplexer 20 for temporary storage. Multiplexer 20 selects each separate output of sampler 16 for transmission to analog-to-digital converter 22 and subsequent processing by processing circuitry.

Flash waveform analyzer 10 of FIG. 1 depicts a technique where the strobe pulse does not arrive at each sampler simultaneously. With this technique, each sampler is activated when the strobe pulse propagates to its site. In a first application of this technique, the strobe pulse is initiated after a desired portion of the signal has entered transmission line 12. The signal propagates down transmission line 12 in the same direction and parallel to the propagation of the strobe pulse down strobe delay line 17. The strobe pulse propagates down strobe delay line 17 to successively activate each sampler 16 according to the propagation velocity of the strobe pulse.

For accurate measurement and analysis, the strobe pulse must catch up with the leading portion of the signal. In order for the strobe pulse to catch up with the leading portion of the signal, the propagation velocity of the signal must be slower than the propagation velocity of the strobe pulse. With this requirement, the signal can be captured trailing portion to leading portion and the signal is effectively sampled at much finer time intervals than the propagation delay time between successive sampling points. For example, if the strobe pulse propagation velocity is twenty-five percent greater than the signal propagation velocity, the equivalent time domain separation is one-fifth of that which would be obtained by simultaneous strobing. The propagation velocity of the signal (or the strobe pulse), can be altered by using different local dielectrics in transmission line 12 (strobe delay line 17), by employing techniques which alter the effective dielectric constant of transmission line 12 (strobe delay line 17), or by adjusting the line dimensions of transmission line 12 (strobe delay line 17).

As a second application of the nonsimultaneous sampling technique, the signal and the strobe pulse may be initiated in opposite directions. The signal is then captured leading portion to trailing portion, however the time scale is coarser by a factor of one plus the ratio of the signal propagation velocity to the strobe propagation velocity than that which would be obtained by simultaneous sampling. Effective sampling rates are traded for the advantage of reducing the length of transmission line 12 required to capture a given length of the signal. For greatest fidelity in this second application, the propagation velocity of the signal should be less than the propagation velocity of the strobe pulse to prevent disturbances caused by sampler strobing from propagating down the signal transmission line to the next sample point before that sample is taken.

In a third application, sampler strobing occurs at different times and separate delay lines 19 are used to strobe each sampler. The separate delay lines 19 and samplers 16 are adjusted so that when a strobe pulse is applied simultaneously to the strobe delay line input, the strobe pulse arrives successively later by a desired time interval at each successive sampler. If the desired strobing time interval is T1 and the time required for the signal to propagate between successive samplers on transmission line 12 is T2 where T2>T1, the effective time domain decreases to T2-T1 while the time domain sample would be T2. The signal is sampled from trailing portion to leading portion, but the advantage over the first application is that very high equivalent time domain sampling can be achieved. While the samplers are strobed before any disturbance from other sampler strobing arrives at the sampler site, distortion will result if the sampling gate remains open long enough to receive transmission line 12 disturbances when they finally arrive.

Though each sampler may not be simultaneously strobed as described above, each sampler also need not be uniformly spaced along transmission line 12. For example, transmission line 12 may have samplers spaced such that the electrical path length between each sampler decreases by one picosecond as distance from the input end of transmission line 12 increases. This is equivalent to time domain sampling at intervals which successfully increase by one pico second.

FIG. 2 is a block diagram of flash waveform analyzer 10 depicting an example of the third application discussed above in which T1=0. In this specific embodiment, transmission line 12 is formed into a circular arc and samplers 16 are uniformly spaced along the circular arc of transmission line 12. Separate delay lines 19 run radially from each sampler 16 to the center of the circular arc formed by transmission line 12 and a strobe pulse from strobe delay line 17 is applied to the center of the circular arc by strobe source 18 such that each sampler 16 is strobed simultaneously. Simultaneous strobing in equally electrically spaced samplers provide results that are directly equivalent to conventional time domain sampling by a single sampler at time intervals of $D/V_s$ where D is the distance between samplers and $V_s$ is the propagation velocity of the signal on transmission line 12.

Though this configuration seems to show that each separate delay line has the same physical length, the separate delay lines need not be of the same physical length. As previously stated, if the desire is to obtain nonsimultaneous sampling, the arrival time of the strobe pulse may be altered by numerous means which include the use of different dielectrics, by employing techniques which alter the effective dielectric constant, or by varying the lengths of the separate delay lines. In this manner, the arrival time of the strobe pulse at each sampler can be tailored. Such adjustments enable the separate delay lines to each sampler to have different physical lengths but the same electrical length or vice versa.

Transmission line 12 will have some bandwidth limitations due to line dispersion and attenuation. Each sampler 16 will also introduce multiple reflections. In order to avoid local disturbances from the samplers 16, samplers 16 should be built into transmission line 12 such that they are included in the characteristic impedance of transmission line 12. To avoid signal distortion, it is also important that the disturbances on transmission line 12 caused by strobing other samplers do not propagate to the site of any sampler before it is strobed. Also, reflections on the strobe line to a sampler 16 may cause resampling by a sampler 16 before data has been read out from the sampler. These problems may occur in the embodiment of FIG. 1. In the embodiment of FIG. 2, these problems are eliminated by maintaining identical electrical lengths of the strobe lines to each sampler 16 and by simultaneously strobing samplers 16.

As can be inferred from the foregoing description, the sampling rate is no longer the critical parameter since multiple samplers are simultaneously activated. In order to effectively capture each signal, the strobe pulse need only be introduced into the strobe lines once per signal to be analyzed. Amplifier bandwidth is also unimportant since samplers 16 hold the data until it can be accurately read.

FIG. 3 is a simplified schematic of a sampler 16. Sampler 16 includes an output sense amplifier 30, a resistor 32, a diode 34, a capacitor 36, and a current source 38. When a strobe pulse is received at sampler 16, diode 34 is biased into conduction allowing a charge to be stored on capacitor 36. Output sense amplifier 30 generates the output provided to multiplexer 20. The circuit of FIG. 3 is one example of a high speed sample circuit and many other different circuit designs can be used to perform the same sample and hold function. All the circuitry including transmission line 12 can be built as part of an integrated circuit allowing a fully solid state implementation.

In summary, a flash waveform analyzer has been described as having a transmission line that includes samplers spaced at different points along the transmission line. A signal is introduced into the transmission line and each sampler is activated by a strobe pulse to measure a characteristic of the signal at the different points along the transmission line. The characteristics of the signal are accessed by a multiplexer that selectively sends each signal characteristic to other circuitry, such as an analog-to-digital converter, for further processing or display.

Thus, it is apparent that there has been provided, in accordance with the present invention, a flash waveform analyzer method and device that satisfies the advantages set forth above. Although the preferred embodiment has been described in detail, it should be understood that various changes, substitutions, and alterations can be made herein without departing from the spirit and scope of the present invention as defined by the following claims.

What is claimed is:

1. A flash waveform analyzer, comprising:

a transmission line for carrying a signal to be measured;

a plurality of samplers in said transmission line for measuring a characteristic of said signal at a plurality of different points along said transmission line, wherein said samplers are activated by a strobe pulse, said strobe pulse propagating to each sampler in a same direction as said signal propagates in said transmission line, said strobe pulse propagating at a faster speed than said signal.

2. The flash waveform analyzer of claim 1, further comprising:

a multiplexer for delivering said characteristic measured at each sampler to circuitry for further processing.

3. The flash waveform analyzer of claim 1, further comprising:

an analog-to-digital converter for converting said characteristic into a digital representation in order to analyze said signal.

4. The flash waveform analyzer of claim 1, wherein said samplers have equidistant spacing within said transmission line.

5. The flash waveform analyzer of claim 1, wherein any disturbing signals created by strobing or signaling cannot propagate to other samplers before corresponding samples are taken.

6. A flash waveform analyzer, comprising:

a transmission line for carrying a signal;

a plurality of samplers within said transmission line for measuring a characteristic of said signal at different points of said transmission line;

a strobe source for providing a strobe pulse; and a plurality of separate delay lines, each separate delay line providing said strobe pulse to activate each sampler, wherein said signal has a propagation velocity slower than a propagation velocity of said strobe pulse to allow for identical electrical lengths despite unequal physical lengths of said separate delay lines to each sampler in order to simultaneously activate said samplers.

7. The flash waveform analyzer of claim 6, further comprising:

a multiplexer for storing said characteristic measured by each sampler; and an analog-to-digital converter for converting said characteristic measured by each sampler into a digital representation in order to analyze transients within said signal.

8. The flash waveform analyzer of claim 6, wherein each separate delay line has an equal propagation delay to each sampler such that each sampler is simultaneously activated by said strobe pulse.

9. The flash waveform analyzer of claim 6, wherein said transmission line is formed into a circular arc such that each separate delay line runs radially to each sampler from a center of said circular arc, said strobe pulse being applied at said center of said circular arc to simultaneously activate said samplers.

10. The flash waveform analyzer of claim 6, wherein said strobe pulse propagates to each sampler along said separate delay lines after a desired portion of said signal has entered said transmission line, said samplers capturing said signal from a trailing portion to a leading portion of said signal.

11. A method of analyzing a waveform, comprising the steps of:

introducing a signal within a transmission line;

measuring a characteristic of the signal at different points along the transmission line; and varying a propagation velocity of the signal such that the strobe pulse propagates faster than the signal to maintain equal propagation delays of the separate delay lines despite unequal physical lengths.

12. The method of claim 11, further comprising the steps of:

storing the characteristic; and converting the characteristic into a digital representation in order to determine transient signals.

13. The method of claim 12, further comprising the step of:

forming the transmission line into a circular arc, each separate delay line running radially from each sampler to a center of the circular arc, wherein each sampler is simultaneously activated by a strobe pulse applied to the center of the circular arc.

14. The method of claim 11, wherein said measuring step includes simultaneously activating a plurality of samplers located at different points along the transmission line with a strobe pulse, the samplers having separate delay lines with equal propagation delays for receiving the strobe pulse.

15. The method of claim 11, further comprising the steps of:

activating a plurality of samplers located along the different points of the transmission line with a strobe pulse after a desired portion of the signal has entered the transmission line;

propagating the signal in the transmission line at a slower speed than the strobe pulse to allow the samplers to capture the signal from trailing edge to leading edge.

16. The method of claim 11, further comprising the steps of:

activating a plurality of samplers located along different points of the transmission line with a strobe pulse, the strobe pulse propagating to each sampler in an opposite direction of propagation of said signal within the transmission line, the samplers capturing the signal from leading portion to trailing portion.

17. The method of claim 11, further comprising the step of:

introducing a strobe pulse to a plurality of samplers located at different points along the transmission line, the samplers activating at different times in response to the strobe pulse in order to measure the characteristic of the signal.

* * * * *